(12) United States Patent
Sim et al.

(10) Patent No.: US 9,042,175 B2
(45) Date of Patent: May 26, 2015

(54) NON-VOLATILE MEMORY DEVICE AND READ METHOD THEREOF

(71) Applicant: SAMSUNG ELECTRONICS CO., LTD., Suwon-si, Gyeonggi-do (KR)

(72) Inventors: Jaesung Sim, Hwaseong-si (KR); Bongyong Lee, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 165 days.

(21) Appl. No.: 13/753,677

(22) Filed: Jan. 30, 2013

(65) Prior Publication Data

US 2013/0194872 A1   Aug. 1, 2013

(30) Foreign Application Priority Data

Jan. 31, 2012  (KR) .................. 10-2012-0009552

(51) Int. Cl.
*G11C 11/34* (2006.01)
*G11C 16/26* (2006.01)
*G11C 16/06* (2006.01)
*G11C 7/04* (2006.01)
*G11C 11/56* (2006.01)
*G11C 16/04* (2006.01)

(52) U.S. Cl.
CPC .............. *G11C 16/26* (2013.01); *G11C 16/06* (2013.01); *G11C 7/04* (2013.01); *G11C 11/5628* (2013.01); *G11C 11/5642* (2013.01); *G11C 16/0483* (2013.01); *G11C 2216/14* (2013.01)

(58) Field of Classification Search
USPC ............. 365/185.03, 185.11, 185.13, 185.17, 365/185.21, 185.24, 189.011, 211
See application file for complete search history.

(56) References Cited

U.S. PATENT DOCUMENTS

| | | | |
|---|---|---|---|
| 6,667,904 B2 | 12/2003 | Takeuchi et al. | |
| 6,882,582 B2 | 4/2005 | Sicard et al. | |
| 7,184,313 B2 | 2/2007 | Betser et al. | |
| 7,411,830 B2 | 8/2008 | Takeuchi et al. | |
| 7,443,733 B2 | 10/2008 | Park | |
| 7,489,578 B2 | 2/2009 | Park | |
| 7,755,946 B2 | 7/2010 | Dunga et al. | |
| 7,898,869 B2 | 3/2011 | Park | |
| 8,238,185 B2 * | 8/2012 | Lee et al. ...................... | 365/211 |
| 2009/0290428 A1 * | 11/2009 | Noh ......................... | 365/185.22 |
| 2010/0277977 A1 | 11/2010 | Nakamura | |
| 2011/0007564 A1 | 1/2011 | Kim | |
| 2011/0310673 A1 * | 12/2011 | Cho et al. ................. | 365/185.22 |
| 2012/0155197 A1 * | 6/2012 | Joo .......................... | 365/189.15 |
| 2012/0230103 A1 * | 9/2012 | Choe et al. ................. | 365/185.2 |
| 2013/0163342 A1 * | 6/2013 | Dutta ....................... | 365/185.21 |
| 2013/0188431 A1 * | 7/2013 | Scheuerlein et al. .... | 365/189.09 |

FOREIGN PATENT DOCUMENTS

| | | | |
|---|---|---|---|
| JP | 2003-217287 | A | 7/2003 |
| JP | 2006-196078 | A | 7/2006 |
| JP | 2010-262696 | A | 11/2010 |
| KR | 10-2007-0071042 | A | 7/2007 |
| KR | 10-2007-0080037 | A | 8/2007 |
| KR | 10-0927782 | B1 | 11/2009 |

* cited by examiner

*Primary Examiner* — Fernando Hidalgo
(74) *Attorney, Agent, or Firm* — Lee & Morse, P.C.

(57) ABSTRACT

Disclosed is a nonvolatile memory device which includes a memory cell connected to a bit line and a word line; a page buffer electrically connected to the bit line and sensing data stored in the memory cell; and a control logic controlling the page buffer to vary a develop time of the bit line or a sensing node connected to the bit line according to a current temperature during a read operation.

16 Claims, 14 Drawing Sheets

NON-VOLATILE MEMORY DEVICE AND READ METHOD THEREOF

CROSS-REFERENCE TO RELATED APPLICATIONS

A claim for priority under 35 U.S.C §119 is made to Korean Patent Application No. 10-2012-0009552 filed Jan. 31, 2012, the entirety of which is incorporated by reference herein.

BACKGROUND

1. Field

The inventive concepts described herein relate to a semiconductor memory device, and more particularly, relate to a nonvolatile memory device capable of adjusting a read parameter according to a temperature and a read method thereof.

2. Description of the Related Art

Semiconductor memory devices may be roughly classified into volatile semiconductor memory devices and nonvolatile semiconductor memory devices. The volatile semiconductor memory devices can perform read and write operations at a high speed, while contents stored therein may be lost at power-off. The nonvolatile semiconductor memory devices may retain contents stored therein even at power-off. The nonvolatile semiconductor memory devices may be used to store contents which must be retained regardless of whether they are powered.

The nonvolatile semiconductor memory devices may include a mask read-only memory (MROM), a programmable ROM (PROM), an erasable programmable ROM (EPROM), an electrically erasable programmable ROM (EEPROM), and the like.

A representative nonvolatile semiconductor memory device may be a flash memory device. The flash memory device may be widely used as a voice and image data storing medium of information appliances such as a computer, a cellular phone, a PDA, a digital camera, a camcorder, a voice recorder, an MP3 player, a handheld PC, a game machine, a facsimile, a scanner, a printer, and the like. In recent years, a multi-bit memory device storing multi-bit data in one memory cell may be becoming increasingly common according to an increasing need for the integrity.

SUMMARY

Example embodiments of the inventive concept provide a nonvolatile memory device which includes a memory cell connected to a bit line and a word line; a page buffer electrically connected to the bit line and sensing data stored in the memory cell; and control logic controlling the page buffer to vary a develop time of the bit line or a sensing node connected to the bit line according to a current temperature during a read operation.

The memory cell may be included in a three-dimensional NAND string formed in a direction vertical to a substrate.

The control logic may sense the memory cell according to a first develop time when the current temperature is over a reference temperature and a second develop time, longer than the first develop time, when the current temperature is below the reference temperature.

The control logic may include a parameter selector selecting a develop time corresponding to the current temperature and a timing controller controlling the page buffer to sense the memory cell according to the selected develop time The parameter selector may include develop times corresponding to a plurality of temperature ranges, respectively.

The develop time may correspond to a time when the bit line being pre-charged is electrically isolated from the sensing node.

The develop time may correspond to a period of time from a point of time when a setup transistor for pre-charging the bit line is turned off, until a point of time when a transistor for connecting the bit line and the sensing node is turned off.

The page buffer may include a clamp transistor for clamping the sensing node into a predetermined level during the develop time.

The nonvolatile memory device may include a voltage generator adjusting and providing a read voltage to be supplied to the word line according to the current temperature.

The nonvolatile memory device may include a temperature sensor sensing the current temperature to provide the sensed current temperature to the control logic.

Example embodiments of the inventive concept also provide a read method of a nonvolatile memory device which includes a three-dimensional NAND string having a channel formed in a direction vertical to a substrate. The read method includes detecting a current temperature; determining a develop time for sensing a memory cell according to the current temperature; and sensing a selected memory cell according to the decided develop time Deciding the develop time may include selecting a first develop time when the current temperature is greater than or equal to a reference temperature, and selecting a second develop time, longer than the first develop time, when the current temperature is below the reference temperature.

Example embodiments of the inventive concept also provide a nonvolatile memory device including a plurality of memory cells connected in series to a bit line; a page buffer connected to the bit line and sensing the memory cell; a voltage generator providing a selection read voltage or a non-selection read voltage to a word line; and control logic controlling the page buffer or the voltage generator to adjust channel currents of the memory cells according to a current temperature during a read operation.

The control logic may control the page buffer to adjust a develop time of the bit line according to the current temperature.

The control logic may control the voltage generator to adjust a level of a non-selection read voltage to be provided to a word line of unselected memory cells according to the current temperature.

Example embodiments of the inventive concept also provide a nonvolatile memory device including a memory cell connected to a bit line and a word line, a page buffer electrically connected to the bit line and sensing data stored in the memory cell, and a control logic controlling the page buffer to vary a width of a sensed threshold distribution according to a current temperature during a read operation.

The nonvolatile memory device may include a temperature sensor sensing the current temperature to provide the sensed current temperature to the control logic.

The control logic may reduce the width of the sensed voltage distribution when the current temperature of the read operation is less than a temperature at which the memory cell was programmed.

The control logic may reduce the width of the sensed voltage distribution by increasing a develop time of the bit line or a sensing node connected to the bit line.

The memory cell may be included in a three-dimensional NAND string formed in a direction vertical to a substrate.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
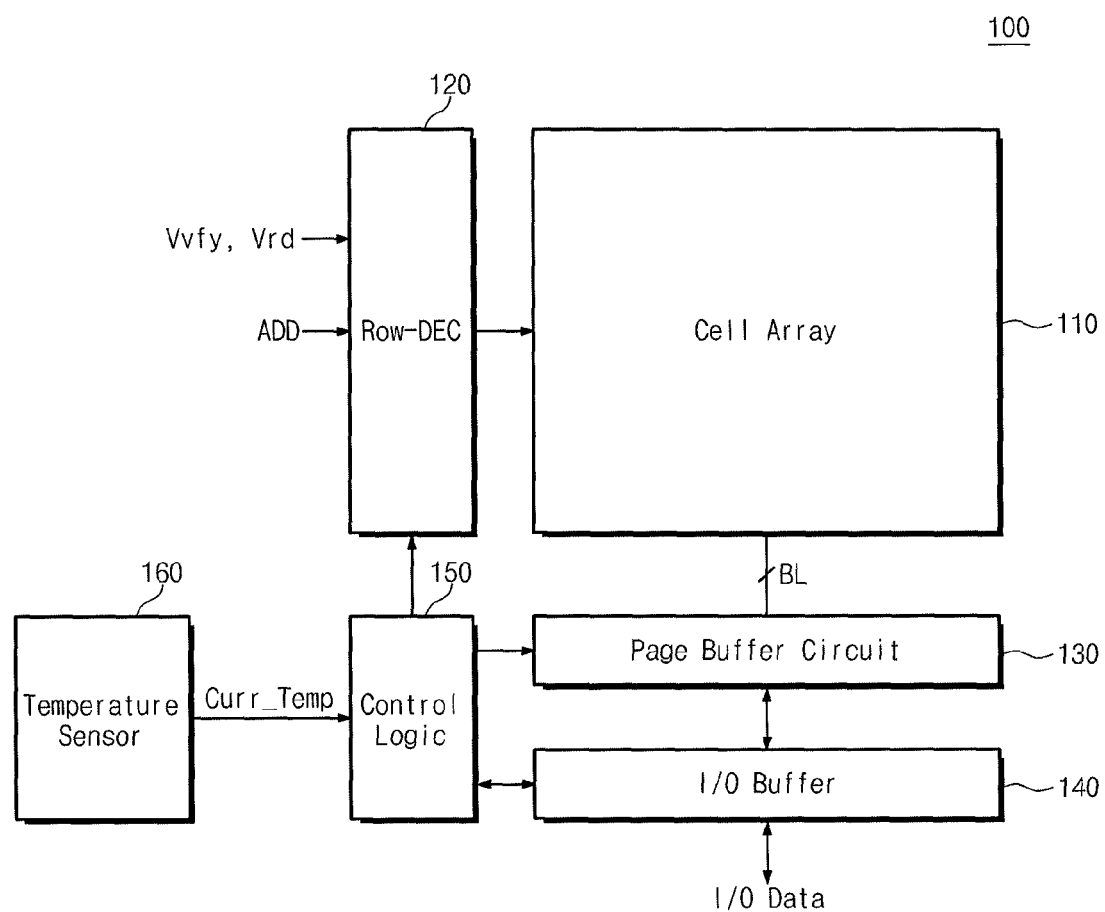
FIG. 1 illustrates a block diagram of a nonvolatile memory device according to an embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 illustrates a block diagram of a nonvolatile memory device according to an embodiment of the inventive concept. Referring to FIG. 1, a nonvolatile memory device 100 may include a cell array 110, a row decoder 120, a page buffer circuit 130, an input/output buffer 140, control logic 150, and a temperature sensor 160.

The cell array 110 may be coupled with the row decoder 120 via word lines or selection lines. The cell array 110 may be coupled with the page buffer circuit 130 via bit lines. The cell array 110 may include a plurality of NAND cell strings, each of which has a channel formed in a vertical or horizontal direction. For example, the word lines of the cell array 110 may be stacked in a vertical direction. A cell string may be formed in a direction perpendicular to a substrate. This may be referred to as a three-dimensional structure or a vertical structure.

The row decoder 120 may select any one of memory blocks of the cell array 110 in response to an address ADD. The row decoder 120 may select one of word lines in the selected memory block in response to the address ADD. The row decoder 120 may provide word lines of the selected memory block with voltages corresponding to modes of operation. During a program operation, the row decoder 120 may transfer a program voltage Vpgm and a verification voltage Vvfy to a selected word line and a pass voltage Vpass to an unselected word line, respectively. During a read operation, the row decoder 120 may transfer a selection read voltage Vrd to the selected word line and a non-selection read voltage Vread to the unselected word line, respectively. During a read operation, the row decoder 120 may provide a verification voltage Vvfy and a selection read voltage Vrd that are adjusted according to a current temperature Curr_Temp.

The page buffer circuit 130 may operate as a write driver or a sense amplifier according to a mode of operation. During a program operation, the page buffer circuit 130 may provide a bit line of the cell array 110 with a bit line voltage corresponding to data to be programmed. During a read operation, the page buffer circuit 130 may sense data stored in a selected memory cell via a bit line. The page buffer circuit 130 may latch the sensed data to output it to the input/output buffer 140. The page buffer circuit 130 may include a plurality of pages connected to the bit lines, respectively. Each page buffer may be configured to adjust a develop time on a bit line under the control of the control logic 150.

During a program operation, the input/output buffer 140 may transfer input write data to the page buffer circuit 130. During a read operation, the input/output buffer 140 may transfer read data provided from the page buffer circuit 130 to an external device. The input/output buffer 140 may transfer input addresses or commands to the control logic 150 or the row decoder 120.

The control logic 150 may control the page buffer circuit 130 and the row decoder 120 in response to a command CMD transferred from the input/output buffer 140. The control logic 150 may control the page buffer circuit 130 and the row decoder 120 to perform program, read, or erase operations for a selected memory cell according to the input command. During a read operation, the control logic 150 may control the page buffer circuit 130 based on the current temperature Curr_Temp. During a read operation, the control logic 150 may adjust sensing timing on a bit line according to the current temperature Curr_Temp. The control logic 150 may control a bit line develop time according to the current temperature Curr_Temp so as to have various periods of time (or, lengths). The control logic 150 may set a DC level adjusted according to the current temperature Curr_Temp. For example, the control logic 150 may control a voltage generator (not shown) such that a read voltage Vrd or a verification voltage Vvfy is controlled according to the current temperature Curr_Temp.

The current temperature Curr_Temp may be provided in real time from the temperature sensor 160 of the nonvolatile memory device 100.

The nonvolatile memory device 100 may perform a control operation in which a channel current of a memory cell varied according to a temperature is compensated. That is, during a read operation, the nonvolatile memory device 100 may make parameter setting to compensate for a channel current varied according to a temperature. For example, the nonvolatile memory device 100 may adjust a bit line develop time according to a current temperature Curr_Temp. The nonvolatile memory device 100 may compensate for a channel current that has been altered according to a variation in temperature by varying a develop time. For example, when a channel current has been reduced due to an increase in temperature, the develop time may be increased.

Figure 2:
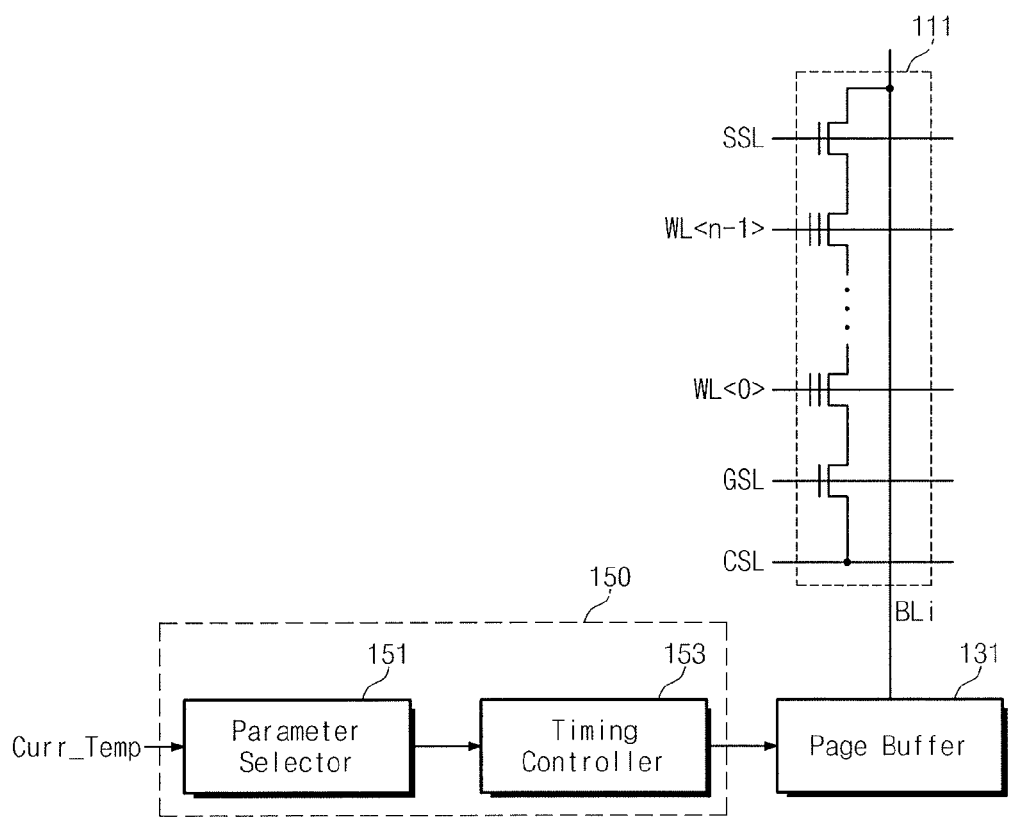
FIG. 2 illustrates a block diagram schematically of control logic in FIG. 1.

FIG. 2 illustrates a block diagram of the control logic 150 shown in FIG. 1. Referring to FIG. 2, control logic 150 of the inventive concept may include a parameter selector 151 and a timing controller 153.

A cell array 110 may include a plurality of cell strings. One bit line BLi may be connected with a plurality of cell strings. In example embodiments, in FIG. 2, a bit line BLi is illustrated as being connected with a cell string 111. A page buffer 131 may sense a selected memory cell via the bit line BLi. Herein, the cell string 111 may have a vertical cell string structure in which a channel is formed to be vertical to a substrate. A channel of a vertical cell string may be formed of polycrystalline silicon instead of monocrystalline silicon. When a channel is formed of polysilicon, a channel current may be reduced when a temperature decreases. Thus, a high threshold voltage may be measured due to a reduced channel current during a sensing operation.

The control logic 150 may control the page buffer 131 to sense the bit line BLi during a read operation. The control logic 150 may adjust a develop time of the bit line BLi connected to the page buffer 131 based on a current temperature Curr_Temp. The above-described operation of the control logic 150 may be made by the parameter selector 151 and the timing controller 153.

The parameter selector 151 may select operating parameters of the nonvolatile memory device 100 corresponding to the current temperature Curr_Temp. The parameter selector 151 may store multiple sets of operating parameters corresponding to temperature levels. For example, the parameter selector 151 may manage parameter sets in a lookup table manner. The parameter selector 151 may select a parameter set corresponding to an input current temperature Curr_Temp and provide a selected parameter set to the timing controller 153. The parameter selector 151 can be configured to select the parameter sets based on the current temperature Curr_Temp and a reference temperature.

The timing controller 153 may control the page buffer 131 according to a parameter set provided from the parameter selector 151. The timing controller 153 may control parameters (e.g., pre-charge point of time, develop point of time, latch point of time, etc.) on the bit line BLi. In particular, the timing controller 153 may adjust a develop time of a bit line based on a parameter set provided from the parameter selector 151. For example, the timing controller 153 may adjust a develop time to become longer when a temperature decreases.

With the above description, the nonvolatile memory device 100 may change a bit line develop time according to a temperature. Thus, the nonvolatile memory device 100 may solve problems due to a variation in a cell current according to a temperature under the same bias condition.

Figure 3:
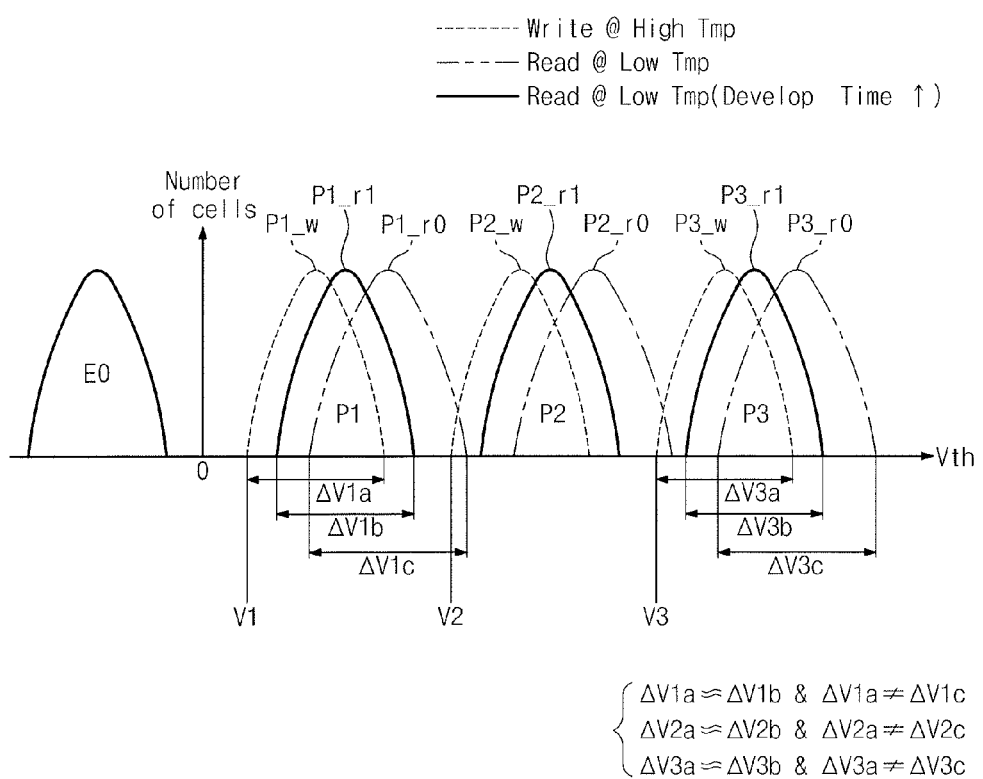
FIG. 3 illustrates an effect according to the inventive concept.

FIG. 3 illustrates an effect of an embodiment. FIG. 3 illustrates a threshold voltage distribution of memory cells each storing 2-bit data. In a 2-bit multi-level cell, data states may include an erase state E0 and program states P1, P2, and P3. Correlation between threshold voltage distributions E0, P1, P2, and P3 and 2-bit data is not limited to this particular example. Correlation between threshold voltage distributions E0, P1, P2, and P3 and 2-bit data may be changed variously. For ease of description, the inventive concept will be described using a 2-bit MLC. However, the inventive concept may be applied to a 3-bit or 4-bit MLC.

Distributions P1_w, P2_w, and P3_w illustrated by a dotted line may be threshold voltage distributions of memory cells programmed or written using verification voltages V1, V2, and V3 at a high temperature. When memory cells having been programmed or written at a high temperature are sensed or read at a low temperature, distributions P1_r0, P2_r0, and P3_r0 may be sensed or read. A threshold voltage of a memory cell measured at a low temperature may be relatively highly due to reduction of a cell current. This may be because a cell current decreases according to lowering of a temperature in a vertical-structured memory in which a channel is formed of polycrystalline silicon. As can be seen in FIG. 3, such a shift may result in the read distributions P1_r0, P2_r0, and P3_r0 overlap more than one write distribution P1_w, P2_w, and P3_w, as discussed in detail below.

A three-dimensional nonvolatile memory may be configured such that word line layers are stacked in a direction vertical to a substrate. The three-dimensional nonvolatile memory may include cell strings channels of which are formed of polycrystalline silicon. Hereinafter, a channel formed of polycrystalline silicon may be referred to as a polycrystalline silicon channel. When sensed at a low temperature, threshold voltages distributions of memory cells each having a polycrystalline silicon channel may widen compared with threshold voltage distributions of memory cells at the time of programming. For example, it is assumed that a threshold voltage distribution P1_w of memory cells corresponding to a state P1 at the time of programming has a width of ΔV1a. A threshold voltage distribution P1_r0 of the same memory cells sensed at a low temperature may have a width ΔV1c wider than the width ΔV1a. The above-described phenomenon may be generated similarly in relation to states P2 and P3. As noted above, this increased width results in a read distribution overlapping more than one write distribution. Thus, for memory cells each having a polycrystalline silicon channel, it is difficult to secure the integrity of data by merely adjusting a read voltage according to the temperature.

In memory cells having a polycrystalline silicon channel, a distribution width varied according to a temperature may be compensated by controlling a develop time according to embodiments. Thus, as illustrated in FIG. 3, when a develop time increases, threshold voltages of memory cells may be read or sensed as having threshold voltage distributions P1_r1, P2_r1, and P3_r1. When a sensing operation is performed with an increased develop time, memory cells programmed to have a state P1 using a verification voltage V1 may be measured as if they are included within a threshold voltage distribution P1_r1 having a width ΔV1b. The width ΔV1b of the threshold voltage distribution P1_r1 may be identical or similar to a width ΔV1a of a threshold voltage distribution at the time of programming. The above-described phenomenon may be shown similarly with respect to memory cells programmed to have states P2 and P3. Thus, a variation in a threshold voltage distribution according to a temperature, which is not solved by merely adjusting a read voltage, may be compensated by controlling a develop time according to embodiments.

With the inventive concept, it is possible to compensate for a variation in a channel current of a memory cell having a polycrystalline silicon channel due to a temperature by controlling a develop time according to embodiments. As a result, it is possible to reduce a read error and to improve the integrity of data.

Figure 4A:
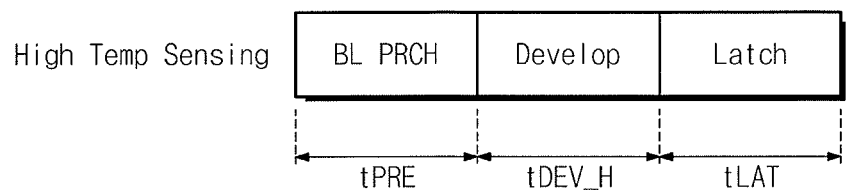
FIGS. 4A and 4B illustrate a sensing method according to an embodiment of the inventive concept.
Figure 4B:
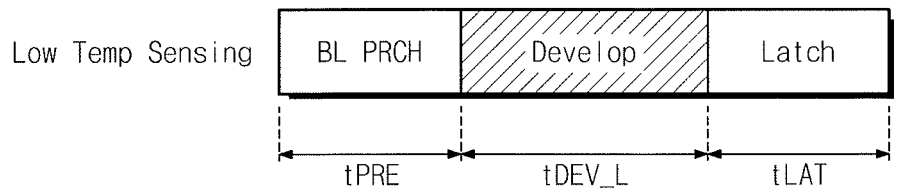

FIGS. 4A and 4B are diagrams describing a sensing method according to an embodiment of the inventive concept.

FIG. 4A is a diagram describing a sensing method at a high temperature. FIG. 4B is a diagram describing a sensing method at a low temperature.

Referring to FIG. 4A, an operation of sensing data stored in a memory cell at a high temperature, i.e., where a current temperature Curr_Temp is higher than a reference temperature or identical to a temperature at the time of programming, is described. An operation of sensing data of memory cells at the above-described condition may include a bit line pre-charge step, a develop step, and a latch step.

At the bit line pre-charge step, all bit lines selected for sensing may be charged with a pre-charge voltage during a pre-charge time tPRE. This may be performed to sense on/off states of memory cells in a high speed. Whether memory cells are turned on or off may be judged according to a voltage variation in a pre-charged bit line or sensing node. That is, a sensing operation may be executed at a high speed.

During a develop time tDEV_H, pre-charged voltages of the bit lines may be varied according to whether memory cells are programmed. When a memory cell has an on state, charges pre-charged at a bit line may be discharged toward a common source line CSL passing through a channel of the memory cell (in case of negative charges, in a reverse direction). Thus, a potential of a bit line may be lowered. On the other hand, when a memory cell has an off state, charges pre-charged at a bit line may not be discharged toward the common source line CSL via a channel of the memory cell. Thus, lowering of a potential of a bit line may be relatively insignificant.

During a latch time tLAT, a potential variation of a bit line may be sensed, and data corresponding to a potential variation may be stored in a sense latch of a page buffer.

Under a condition similar or identical to a temperature condition at the time of programming, the develop time tDEV_H defined at the develop step may be similar or identical to a default value initially set to a nonvolatile memory device. That is, a shift of a threshold voltage due to a decrease in a channel current may not be considered under a high-temperature condition.

Referring to FIG. 4B, an operation of sensing data stored in a memory cell at a low temperature where a current temperature Curr_temp is lower than a reference temperature or lower than a temperature at the time of programming is described. An operation of sensing data of memory cells at the above-described condition may include a bit line pre-charge step, a develop step, and a latch step.

At the bit line pre-charge step, all bit lines selected for sensing may be charged with a pre-charge voltage during a pre-charge time tPRE. During a pre-charge operation, the bit lines may be charged with the pre-charge voltage having a specific level.

During a develop time tDEV_L, pre-charged voltages of the bit lines may be varied according to whether memory cells are programmed. When a memory cell has an on state, charges pre-charged at a bit line may be discharged toward a common source line CSL passing through a channel of the memory cell (in case of negative charges, in a reverse direction). Thus, a potential of a bit line may be lowered. On the other hand, when a memory cell has an off state, charges pre-charged at a bit line may not be discharged toward the common source line CSL via a channel of the memory cell. Thus, lowering of a potential of a bit line may be relatively insignificant.

Herein, the develop time tDEV_L may be relatively longer than the develop time tDEV_H. With the develop time tDEV_L selected for the low-temperature condition, problems caused by a cell current reduced at a low temperature may be minimized or prevented.

During a latch time tLAT, a potential variation of a bit line may be sensed, and data corresponding to a potential variation may be stored in a sense latch of a page buffer.

In example embodiments, the develop time tDEV_L selected for use when a current temperature for the read or sense operation is lower than a temperature at the time of programming may be relatively longer than the develop time tDEV_H selected for use when a current temperature for the read or sense operation is a higher than or equal to a temperature at the time of programming. Thus, influence of a channel current that has been relatively reduced when a current temperature is low may be compensated.

Figure 5:
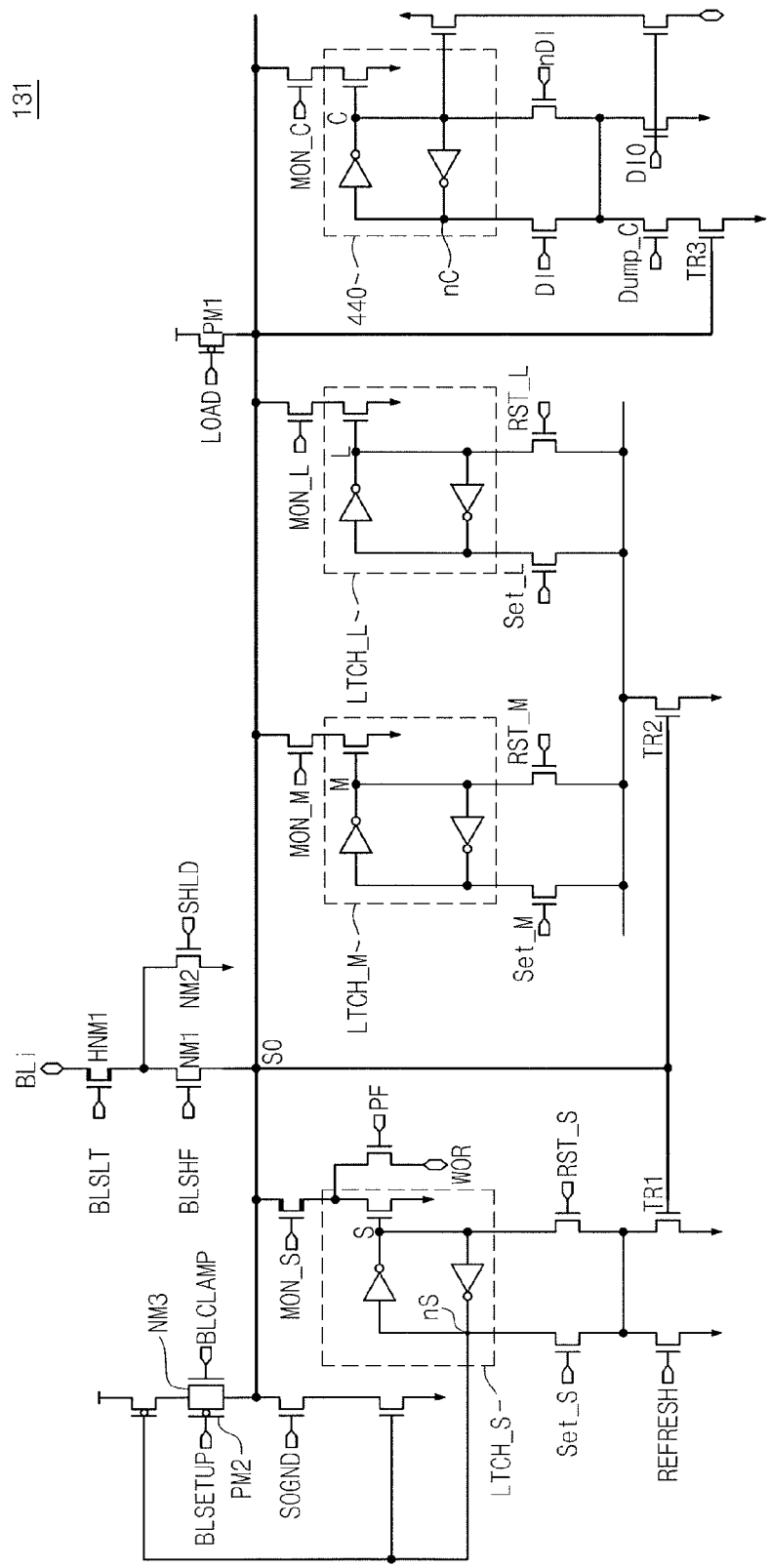
FIG. 5 illustrates a schematic circuit diagram of a page buffer according to an embodiment of the inventive concept.

FIG. 5 is a circuit diagram schematically illustrating a page buffer according to an embodiment of the to the inventive concept may include four latches LTCH_S, LTCH_M, LTCH_L, and LTCH_C.

Each of the latches LTCH_S, LTCH_M, LTCH_L, and LTCH_C may be connected to a sensing node S0. Each of the latches LTCH_S, LTCH_M, LTCH_L, and LTCH_C may be connected to a bit line BLi via the sensing node S0. Herein, multi-bit data may be stored in a memory cell via the bit line BLi according to data loaded onto the latches LTCH_S, LTCH_M, LTCH_L, and LTCH_C. Embodiments are related to an operation of sensing data stored in a memory cell. Thus, how a bit line is pre-charged, developed, and latched via the page buffer 131 will be described.

At pre-charging, PMOS transistors PM1 and PM2 and NMOS transistors NM1 and HNM1 may be turned on. A load signal LOAD and a setup signal BLSETUP may be set to 0V or a ground voltage level to turn on the PMOS transistors PM1 and PM2. In this case, the sensing node S0 may be charged up to a predetermined voltage level. Further, the bit line BLi connected to the sensing node S0 may be charged up to a predetermined voltage level. Pre-charging of the bit line BLi may be performed until the setup signal BLSETUP goes to a high level and the PMOS transistors PM1 and PM2 are turned off.

When the setup signal BLSETUP goes to a high level and the PMOS transistors PM1 and PM2 are turned off, the bit line BLi may start to be developed. Since the NMOS transistors NM1 and HNM1 maintain a turn-on state, charges charged at the bit line BLi may be discharged into a common source line CSL or maintained according to whether a selected memory cell is turned on or off. In particular, during developing, as a clamp signal BLCLAMP has a second clamp voltage lower than a voltage provided at pre-charging, a potential of the sensing node S0 may be maintained over a predetermined level. Afterwards, during latching, a level of the sensing node S0 may be detected by the register (or latch) LTCH_S to be latched as data.

After the PMOS transistors PM1 and PM2 are turned off, a turn-off period of the NMOS transistor NM1 may correspond to the develop time tDEV. The nonvolatile memory device 100 according to an embodiment may control the develop time tDEV by detecting a current temperature. For example, the nonvolatile memory device 100 may provide the first develop time tDEV_H at a high temperature higher than or equal to a reference temperature and the second develop time tDEV_L at a temperature lower than the reference temperature. The develop time tDEV can be subdivided according to various current temperature levels.

Figure 6:
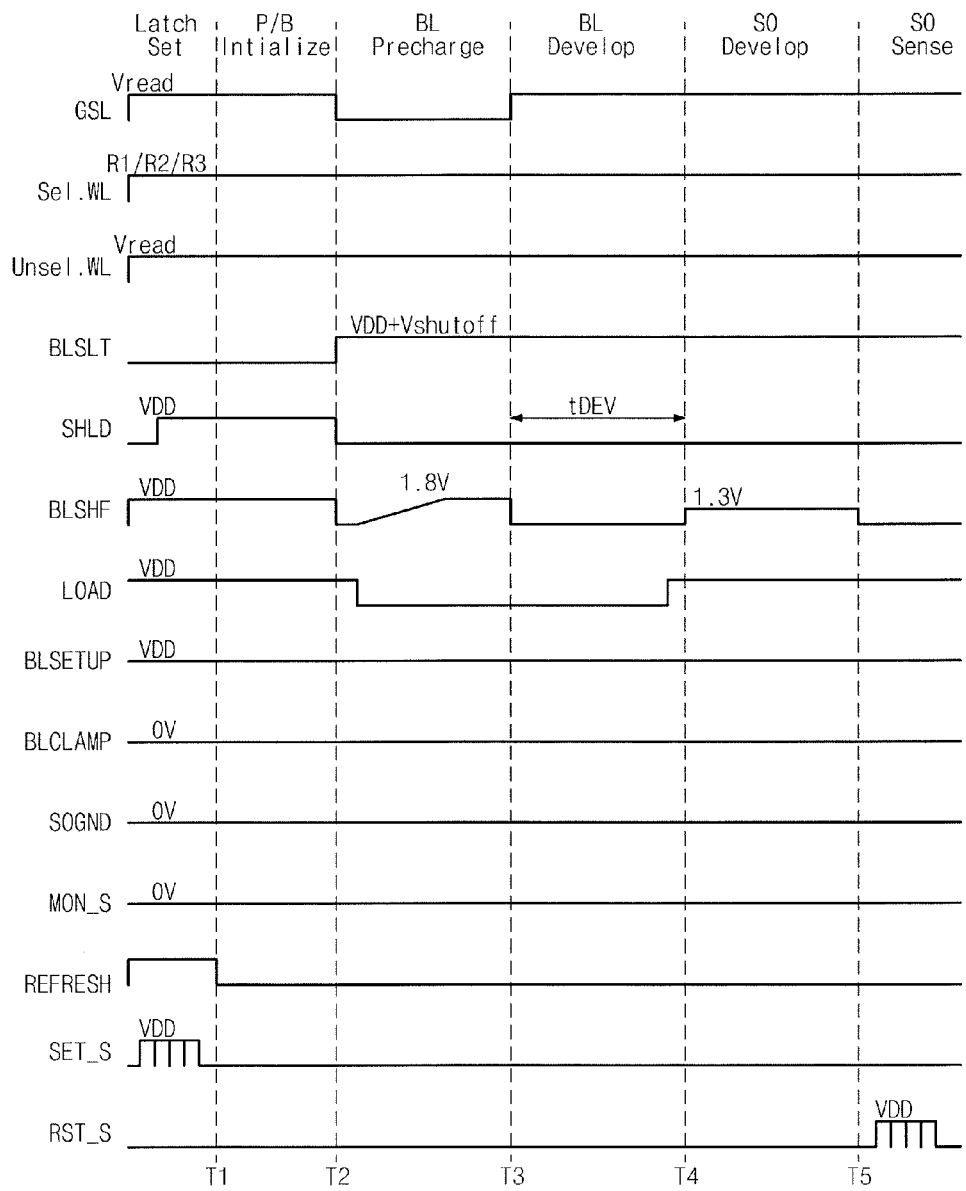
FIGS. 6 and 7 are timing diagrams illustrating a sensing operation of a page buffer in FIG. 5.
Figure 7:
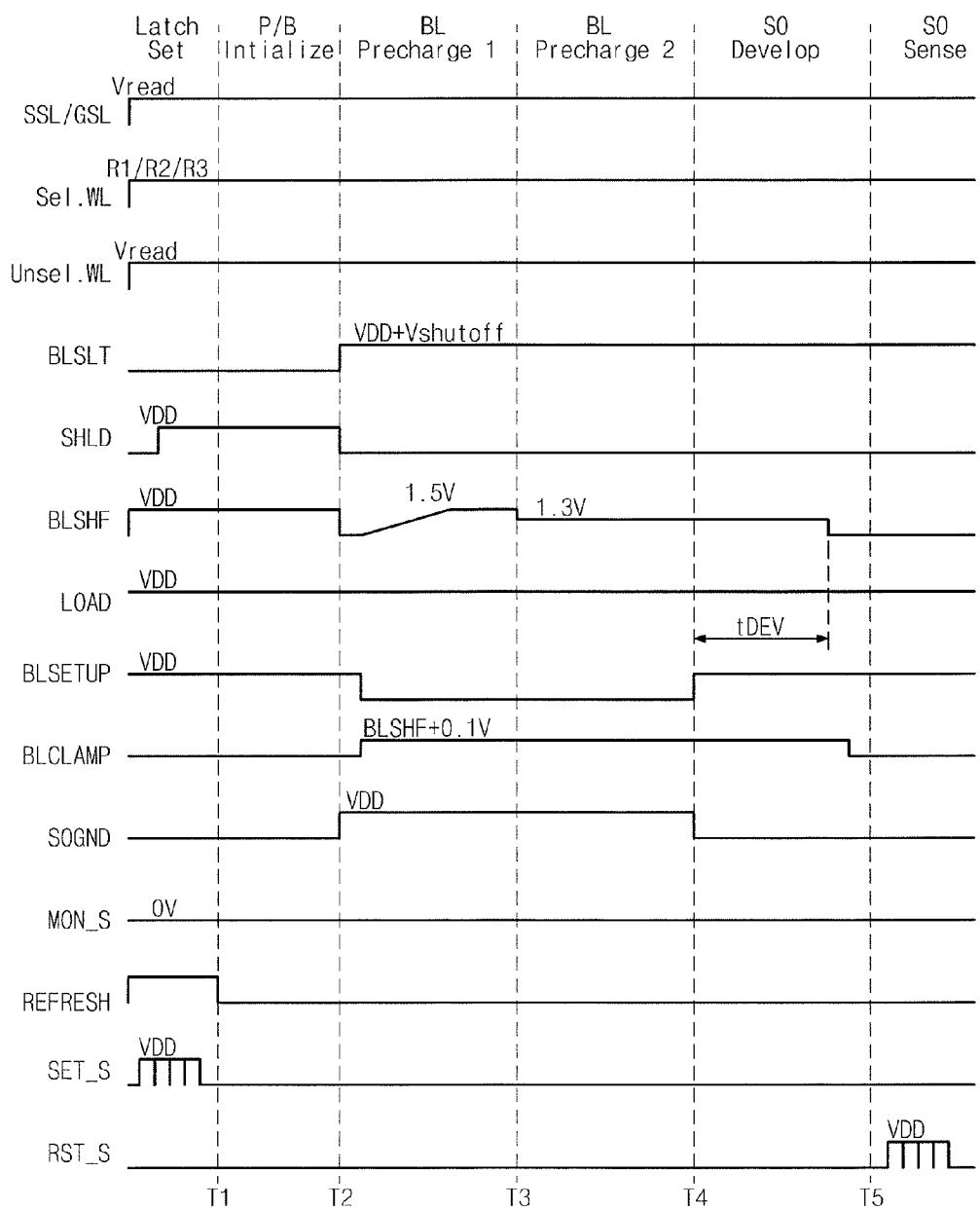

FIGS. 6 and 7 are timing diagrams describing a sensing operation of a page buffer in FIG. 5. FIG. 6 is a timing diagram of a page buffer during a mode where sensing is performed via a bit line. FIG. 7 is a timing diagram of a page buffer driven in a high-speed sensing mode.

An operation of a page buffer 131 during a conventional sensing mode will be described with reference to FIGS. 5 and 6. A bit line may be sensed at the conventional sensing mode. During sensing, a read voltage R1/R2/R3 may be applied to a selected word line and a non-selection read voltage Vread may be applied to unselected word lines. During the sensing, a setup signal BLSETUP having 0V or a ground voltage VSS may be provided to a PMOS transistor PM2. That is, the PMOS transistor PM2 may be turned off. Setting of latches LTCH_S, LTCH_M, LTCH_L, and LTCH_C and initialization of the page buffer 131 may be performed until T2.

After initialization, a bit line may start to be pre-charged from T2. A control signal BLSLT may have a level of (VDD+Vshutoff) higher than a power supply voltage VDD such that an NMOS transistor HNM1 is turned off. That is, a bit line may be pre-charged. During the sensing, an NMOS transistor NM2 may be turned off by a control signal SHLD having 0V or a ground level VSS. A PMOS transistor PM1 may be turned off by a load signal LOAD having 0V or a ground level VSS. A control signal BLSHF having a slow rising slope may be provided to supply a voltage to the bit line BLi via the NMOS transistor NM1.

After the bit line BLi is pre-charged, developing may begin from T3. At this time, a ground selection line GSL set to a ground level during a pre-charge time tPRE may be supplied with the non-selection read voltage Vread. The sensing node S0 and the bit line BLi may be isolated by setting a control signal BLSHF to 0V and blocking the NMOS transistor NM1. A period between T3 and T4 in which the NMOS transistor NM1 maintains a turn-off state may correspond to a develop time tDEV of the bit line BLi.

After the develop time tDEV, a sensing node develop operation may be performed. At this time, the NMOS transistor NM1 may be slightly turned on to reflect a develop result of the bit line BLi on the sensing node S0. The NMOS transistor NM1 may be slightly turned on by providing the control signal BLSHF having a voltage of 1.3V lower than that at the pre-charging.

When the sensing node develop operation ends, a reset signal RST_S may be activated at T5, and a value of a sensing latch LTCH_S may be switched into a corresponding logic value according to a voltage level of the sensing node S0.

A conventional sensing manner including dumping a bit line developed result into the sensing node S0 and sensing the sensing node S0 is described with reference to FIG. 6. Herein, a develop time tDEV may correspond to a period between T3 and T4 in which the sensing node S0 and the bit line BLi are electrically isolated. Thus, control logic 150 may adjust activation of a load signal LOAD and a length of a develop time tDEV when a control signal BLSHF maintains 0V, based on a current temperature Curr_Temp. That is, the load and control signals LOAD and BLSHF may be set such that a develop time tDEV becomes longer when a current temperature decreases according to embodiments.

FIG. 7 is a timing diagram describing an example that a page buffer is driven in a high-speed sensing mode. Referring to FIG. 7, during a high-speed sensing mode, operations of developing a bit line BLi and dumping a developed result into a sensing node S0 may not be divided.

During sensing, a read voltage R1/R2/R3 may be applied to a selected word line and a non-selection read voltage Vread may be applied to unselected word lines. During the sensing, a setup signal BLSETUP having 0V or a ground voltage VSS may be provided to a PMOS transistor PM2. That is, the PMOS transistor PM2 may be turned off. Setting of latches LTCH_S, LTCH_M, LTCH_L, and LTCH_C and initialization of the page buffer 131 may be performed until T2.

After initialization, a bit line may start to be pre-charged from T2. That is, a first pre-charge period may commence. A control signal BLSLT may have a level of (VDD+Vshutoff) higher than a power supply voltage VDD such that an NMOS transistor HNM1 is turned off. That is, a bit line may be pre-charged. During the sensing, an NMOS transistor NM2 may be turned off by a control signal SHLD having 0V or a ground level VSS. A control signal BLSHF having a slow rising slope may be provided to supply a voltage to the bit line BLi via the NMOS transistor NM1. A PMOS transistor PM2 may be turned on by a setup signal BLSETUP that goes to 0V or a ground voltage. Further, an NMOS transistor NM3 may be turned on by a clamp signal BLCLAMP that has a voltage higher by a predetermined level (about 1V) than that of the control signal BLSHF.

At T3, a second pre-charge period, in which the control signal BLSHF has a voltage lower in level than that of the first pre-charge period, may be started. A sensing node develop period may start from T4. At T4, a voltage level of the setup signal SBLSETUP may be returned to a power supply voltage VDD level such that the PMOS transistor PM2 is turned off. Afterwards, the control signal BLSHF and the clamp signal BLCLAMP may have 0V or a ground voltage VSS. At T5, the sensing node may be latched.

In case of the high-speed sensing mode, a period of time to a point of time when the NMOS transistor NM1 is blocked, from T4 when the PMOS transistor PM2 is turned off may be defined as a develop time tDEV. Thus, in accordance with embodiments, based on a current temperature Curr_Temp, the control logic 150 may adjust a develop time tDEV from inactivation of the setup signal BLSETUP until a point of time when the control signal BLSHF goes to 0V.

Figure 8:
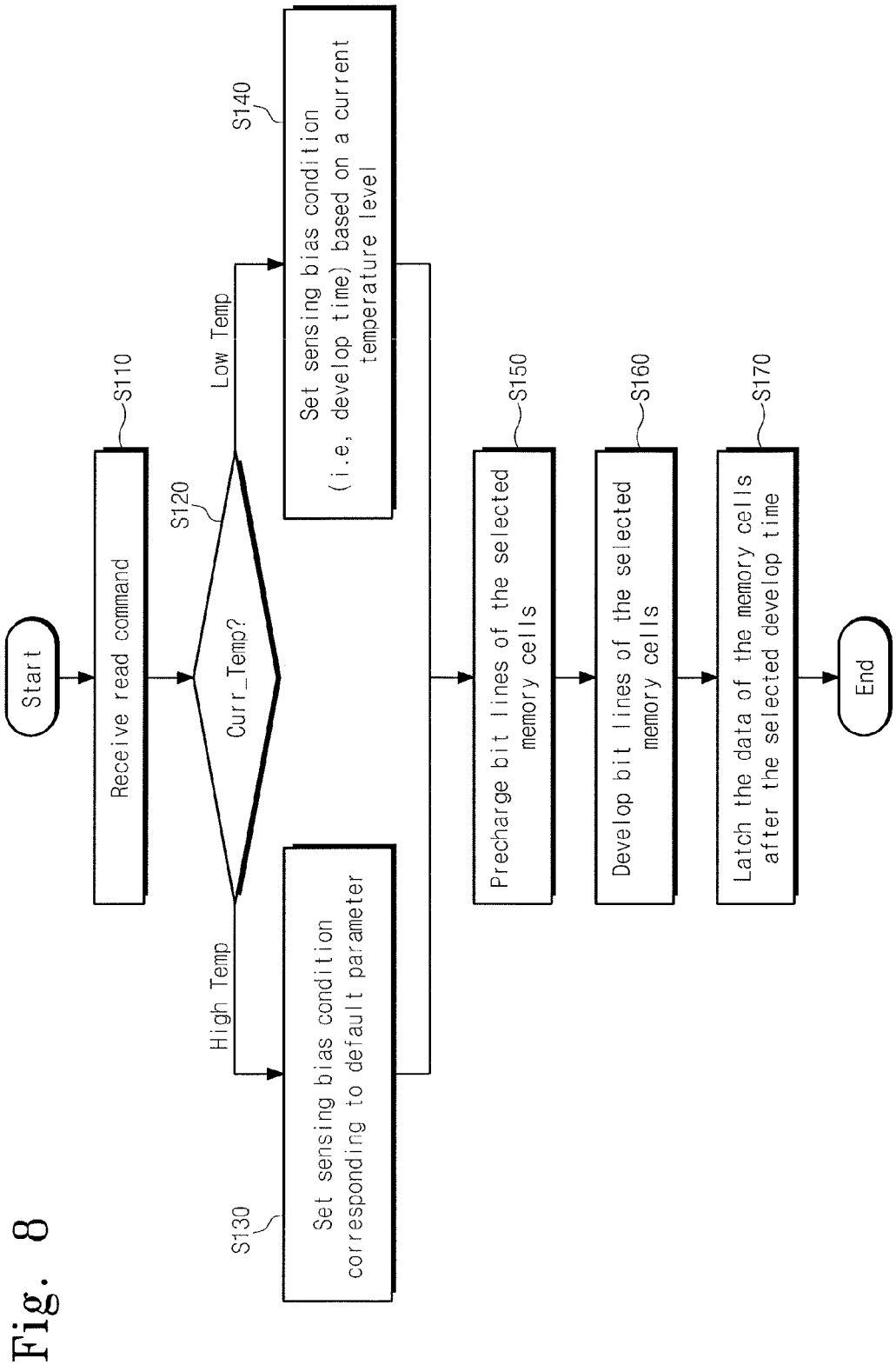
FIG. 8 illustrates a flowchart of a read method of a nonvolatile memory device according to an embodiment of the inventive concept.

FIG. 8 illustrates a flowchart of a read method of a nonvolatile memory device according to an embodiment of the inventive concept. A read method for controlling a bit line develop time tDEV according to a current temperature Curr_Temp will be described with reference to FIG. 8.

In operation S110, a nonvolatile memory device 100 may receive a read command from an external device. The nonvolatile memory device 100 may decode the read command (or, read command sequence) to select memory cells to be sensed.

In operation S120, the nonvolatile memory device 100 may detect a current temperature in response to the read command. The current temperature Curr_Temp can be provided in real time via the temperature sensor 160 of the nonvolatile memory device 100.

When the current temperature Curr_Temp is a high temperature higher than or equal to a reference temperature, the method proceeds to operation S130. When the current temperature Curr_Temp is a temperature lower than the reference temperature, the method proceeds to operation S140.

In operation S130, the nonvolatile memory device 100 may set a sensing bias condition to a default parameter. That is, the nonvolatile memory device 100 may sense selected memory cells without adjusting of a develop time (e.g., tDEV_H) at a high-temperature condition.

In operation S140, the nonvolatile memory device 100 may adjust a bias condition to perform a sensing operation using an increased develop time (e.g., tDEV_L) to compensate for reduction of a channel current generated at a low temperature.

In operation S150, a page buffer 131 may pre-charge bit lines according to a set sensing bias condition. Pre-charging of bit lines may be performed the same as described in relation to FIG. 5. That is, the bit lines may be pre-charged with a predetermined voltage level by providing a bit line BLI connected to a sensing node S0 with a pre-charge voltage.

In operation S160, the charged bit line and the sensing node S0 may be electrically connected during a develop time. At this time, a pre-charged voltage of the bit line may vary according to a threshold voltage of a memory cell during the develop time tDEV_L or tDEV_H. When a memory cell is at an on state, charges pre-charged at the bit line may be discharged toward a common source line CSL via a channel of the memory cell. That is, a potential of the bit line may be lowered. On the other hand, when a memory cell has an off state, charges pre-charged at a bit line may not be discharged toward the common source line CSL via a channel of the memory cell. Thus, lowering of a potential of a bit line may be relatively insignificant.

After the develop time tDEV_L or tDEV_H is terminated, in operation S170, the bit line BLi and the sensing node S0 may be isolated. At this time, a voltage level of the sensing node S0 may be latched by a sensing latch LICH_S as data. The data latched by the sensing latch LTCH_S may be output to an input/output buffer 140. The input/output buffer 140 may transfer the input data to an external device.

With the read method of the nonvolatile memory device 100, a develop time during a sensing operation may be adjusted according to a current temperature Curr_Temp. Thus, it is possible to compensate for a variation of a threshold voltage due to a channel current of a memory cell varied according to a temperature.

Figure 9:
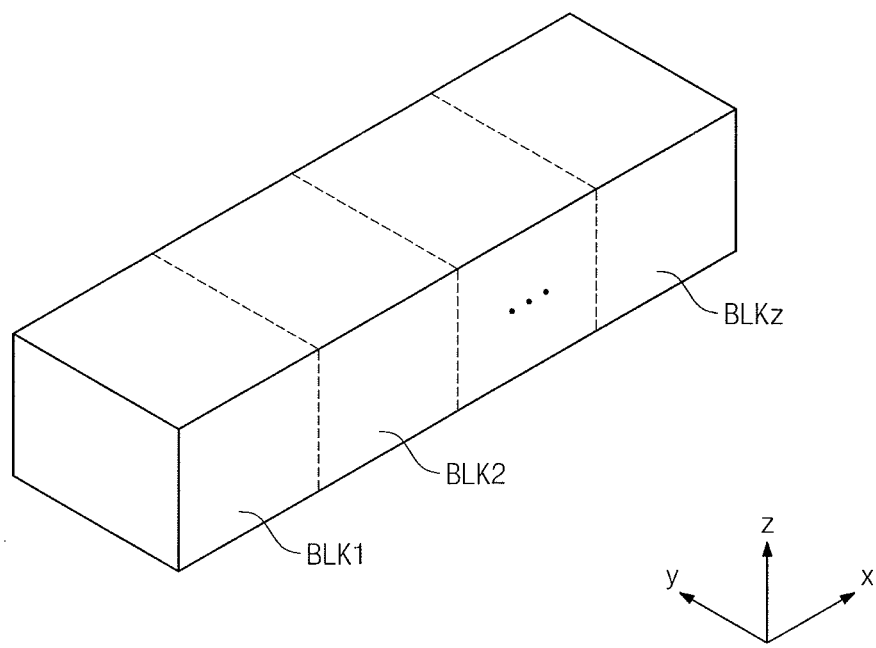
FIG. 9 illustrates a cell array in FIG. 1 according to an embodiment of the inventive concept.

FIG. 9 is a diagram illustrating a cell array in FIG. 1 according to an embodiment of the inventive concept. Referring to FIG. 9, a cell array 110 may include a plurality of memory blocks BLK1 to BLKz, each of which is formed to have a three-dimensional structure (or, a vertical structure). For example, each of the memory blocks BLK1 to BLKz may include structures extending along first to third directions x, y, and z. Each of the memory blocks BLK1 to BLKz may include a plurality of NAND cell strings extending along the third direction z.

Each NAND cell string may be coupled with a bit line BL, a string selection line SSL, a plurality of word lines WL, a ground selection line GSL, and a common source line CSL. That is, each memory block may be coupled with a plurality of bit lines, a plurality of string selection lines, a plurality of word lines, a plurality of ground selection lines, and a common source line CSL. Memory blocks will be more fully described with reference to FIG. 10.

Figure 10:
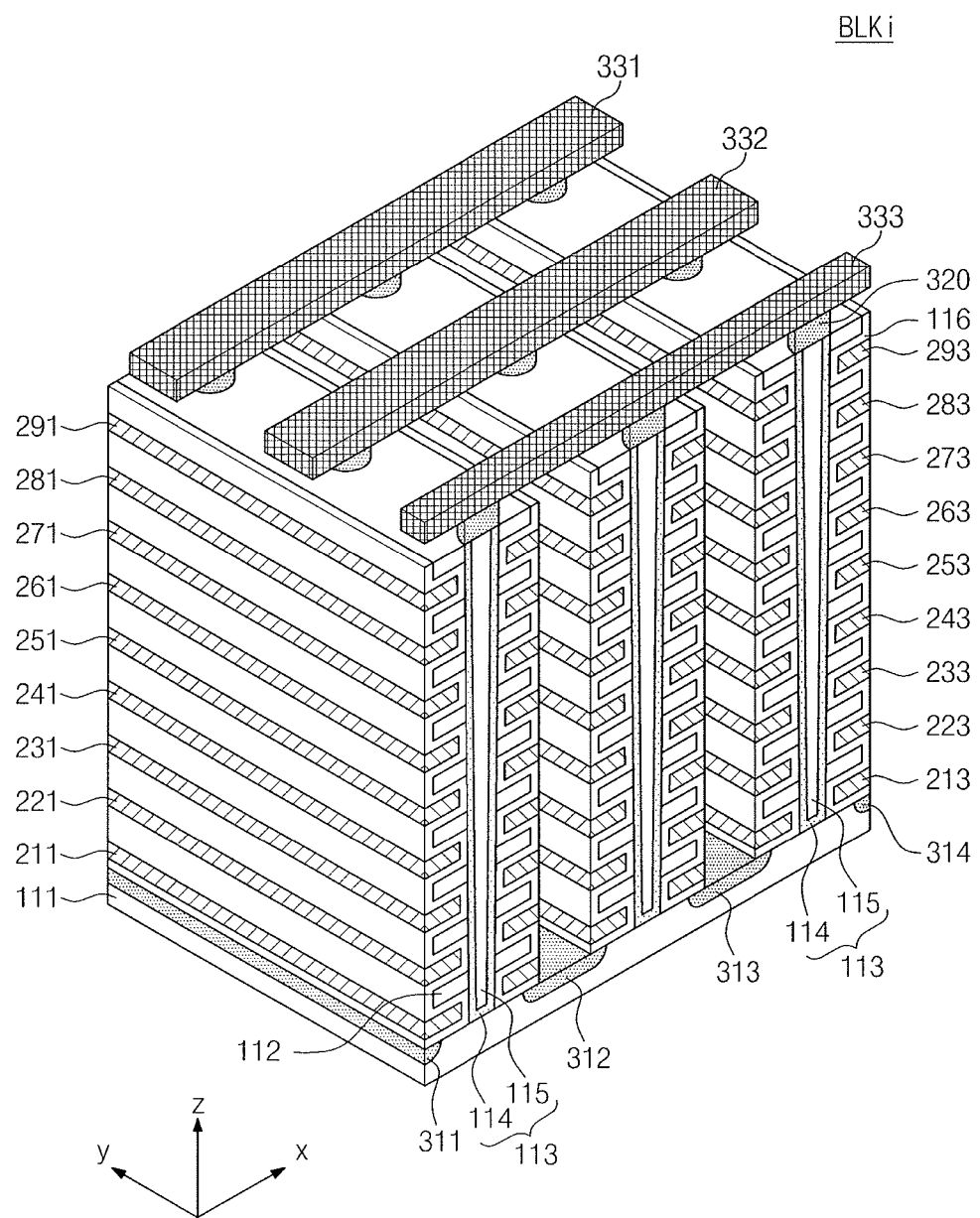
FIG. 10 illustrates a perspective view of one of memory blocks in FIG. 9.

FIG. 10 is a perspective view of one of memory blocks in FIG. 9. Referring to FIG. 10, a memory block BLKi may include structures that are extended along first to third directions x, y, and z.

A substrate 111 may be provided to form the memory block BLKi. For example, the substrate 111 may be formed of a p-well where element such as boron is injected. Alternatively, the substrate 111 may be a pocket p-well provided within an n-well. Hereinafter, it is assumed that the substrate 111 is a p-well. However, the substrate 111 is not limited thereto.

A plurality of doping regions 311 to 314 extended in the first direction x may be provided onto the substrate 111. For example, the doping regions 311 to 314 may have an n-type, respectively. Hereinafter, it is assumed that the first to fourth doping regions 311 to 314 are an n-type. However, the first to fourth doping regions 311 to 314 are not limited thereto.

At a region on the substrate 111 between the first and second doping regions 311 and 312, a plurality of insulating materials 112 extending along the first direction may be sequentially provided along the third direction. For example, the plurality of insulating materials 112 may be formed to be spaced apart along the third direction z. In example embodiments, the insulating materials 112 may include an insulating material such as silicon oxide.

On the substrate 111 between the first and second doping regions 311 and 312, a plurality of pillars 113 may be provided which are sequentially disposed along the second direction and pass through the insulating materials 112 along the third direction. In example embodiments, the pillars 113 may be connected to the substrate 111 through the insulating materials 112, respectively. Herein, the pillars 113 may be formed on the substrate 111 between the second and third doping regions 312 and 313 and between third and fourth doping regions 313 and 314, respectively.

In example embodiments, each of the pillars 113 may be formed of a plurality of materials. For example, the surface layer 114 of each pillar 113 may include a silicon material having the first type. For example, the surface layer 114 of each pillar 113 may include a silicon material which is doped by the same type of the substrate 111. Hereinafter, it is assumed that the surface layer 114 of each pillar 113 includes p-type silicon. However, the surface layer 114 of each pillar 113 is not limited thereto.

The inner layer 115 of each pillar 113 may be formed of an insulating material. For example, the inner layer 115 of each pillar 113 may be filled by an insulating material such as silicon oxide. For example, the inner layer 115 of each pillar 113 may include air gap.

In a region between the first and second doping regions 311 and 312, an insulation layer 116 may be provided along the exposed surfaces of the substrate 111, the insulating materials 112, and the pillars 113. In example embodiments, there can be removed an insulation layer 116 provided at an exposed surface toward the third direction z of the last insulation material 112.

In example embodiments, the thickness of the insulation layer 116 may be less than half a distance between the insulating materials 112. That is, a region where a material other than the insulating materials 112 and the insulation layer 116 may be disposed, may be provided between an insulation layer 116 provided on a lower surface of the first insulating material among the insulating materials 112 and an insulation layer 116 provided on an upper surface of the second insulating material and at the lower portion of the first insulating material.

In the region between the first and second doping regions 311 and 312, the first conductive materials 211 to 291 may be provided onto an exposed surface of the insulation layer 116. For example, the conductive material 211 extending along the second direction y may be provided between the substrate 111 and the insulating material 112 adjacent to the substrate 111. More specifically, the conductive material 211 extending along the first direction x may be provided between the substrate 111 and the insulation layer 116 of the lower surface of the insulating material 112 adjacent to the substrate 111.

The first conductive material extending along the first direction may be provided between the insulation layer 116 of an upper surface of a specific insulating material among the insulating materials 112 and the insulation layer 116 of a lower surface of an insulating material disposed at the upper portion of the specific insulating material. In example embodiments, the first conductive materials 221 to 281 extending along the first direction may be provided between the insulating materials 112. In example embodiments, the first conductive materials 211 to 291 may be metal materials. In example embodiments, the conductive materials 211 to 291 may be conductive materials, such as polysilicon.

The same structure as formed on the first and second doping regions 311 and 312 may be provided between the second and third doping regions 312 and 313. Between the second and third doping regions 312 and 313, there may be provided the insulating materials 112 extending along the first direction, the pillars 113 sequentially disposed along the first direction and passing through the insulating materials 112 along the third direction, the insulation layer 116 on the insulating materials 112 and exposed surfaces of the pillars 113, and the first conductive materials 212 to 292 extending along the first direction.

The same structure as formed on the first and second doping regions 311 and 312 may be provided between the third and fourth doping regions 313 and 314. Between the third and fourth doping regions 313 and 314, there may be provided the insulating materials 112 extending along the first direction, the pillars 113 sequentially disposed along the first direction and passing through the insulating materials 112 along the third direction, the insulation layer 116 on the insulating materials 112 and the exposed surfaces of the pillars 113, and the conductive materials 213 to 293 extending along the first direction.

Drains 320 may be provided onto the pillars 113, respectively. In example embodiments, the drains 320 may be silicon materials that are doped in a second type. For example, the drains 320 may be n-type silicon materials. Hereinafter, it is assumed that the drains 320 may include n-type silicon. However, the drains 320 are not limited thereto. In example embodiments, the width of each of the drains 320 may be greater than that of a corresponding pillar 113. For example, each drain 320 may be provided in a pad shape on the upper surface of a corresponding pillar 113.

The second conductive materials 331 to 333 extending along the third direction may be provided onto the drains 320. The second conductive materials 331 to 333 may be sequentially disposed along the first direction. The second conductive materials 331 to 333 may be connected to the drains 320 of corresponding regions, respectively. In example embodiments, the drains 320 and the conductive material extending along the third direction may be connected through contact plugs. In example embodiments, the second conductive materials 331 to 333 extending along the third direction may be metal materials. In example embodiments, the second conductive materials 331 to 333 may be conductive materials, such as polysilicon.

Figure 11:
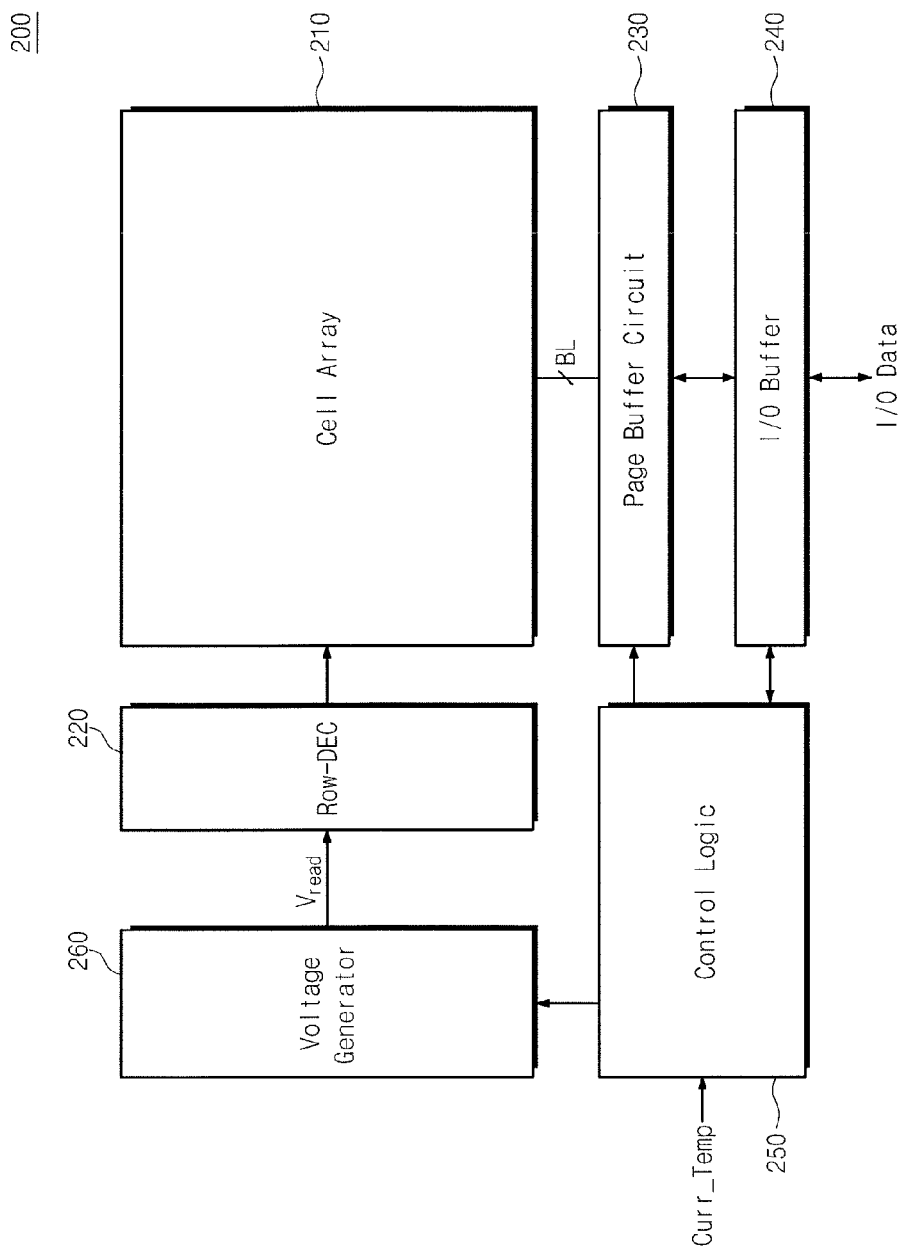
FIG. 11 illustrates a block diagram of a nonvolatile memory device according to another embodiment of the inventive concept.

FIG. 11 is a block diagram schematically illustrating a nonvolatile memory device according to another embodiment of the inventive concept. Referring to FIG. 11, a nonvolatile memory device 200 may include a cell array 210, a row decoder 220, a page buffer circuit 230, an input/output buffer 240, control logic 250, and a voltage generator 260.

The cell array 210 may be coupled with the row decoder 220 via word lines or selection lines. The cell array 210 may be coupled with the page buffer circuit 230 via bit lines BL0 to BLn−1. The cell array 210 may include a plurality of NAND cell strings, each of which includes a channel formed in a vertical or horizontal direction. The word lines of the cell array 210 may be stacked in a vertical direction.

The row decoder 220 may select any one of memory blocks of the cell array 210 in response to an address ADD. The row decoder 220 may select one of word lines in the selected memory block in response to the address ADD. The row decoder 220 may transfer voltages provided from the voltage generator 260 to word lines of the selected memory block. During a program operation, the row decoder 220 may transfer a program voltage Vpgm and a verification voltage Vvfy to a selected word line and a pass voltage Vpass to an unselected word line, respectively. During a read operation, the row decoder 220 may transfer a selection read voltage Vrd to the selected word line and a non-selection read voltage Vread to the unselected word line, respectively.

The page buffer circuit 230 may operate as a write driver or a sense amplifier according to a mode of operation. During a program operation, the page buffer circuit 230 may provide a bit line of the cell array 210 with a bit line voltage corresponding to data to be programmed. During a read operation, the page buffer circuit 230 may sense data stored in a selected memory cell via a bit line. The page buffer circuit 230 may latch the sensed data to output it to the input/output buffer 240. The page buffer circuit 230 may include a plurality of pages connected to the bit lines BL0 to BLn−1, respectively. Each page buffer may adjust a develop time on a bit line according to the control of the control logic 250.

During a program operation, the input/output buffer 240 may transfer input write data to the page buffer circuit 230. During a read operation, the input/output buffer 240 may transfer read data provided from the page buffer circuit 230 to an external device. The input/output buffer 240 may transfer input addresses or commands to the control logic 250 or the row decoder 220.

The control logic 250 may control the page buffer circuit 130 and the row decoder 220 in response to a command CMD transferred from the input/output buffer 240. During a read operation, the control logic 250 may control the page buffer circuit 230 and the voltage generator 260 based on the current temperature Curr_Temp. During a read operation, the control logic 150 may adjust a level of the non-selection read voltage Vread according to the current temperature Curr_Temp. During a read operation, the control logic 250 may variously adjust a level of the non-selection read voltage Vread provided to an unselected word line according to the current temperature Curr_Temp. As a result, a magnitude of a channel current of a memory cell may be adjusted by adjusting a level of the non-selection read voltage Vread.

The voltage generator 260 may generate word line voltages to be supplied to word lines and a voltage to be supplied to a bulk (e.g., a well region) where memory cells are formed, under the control of the control logic 250. The word line voltages to be supplied to word lines may include a program voltage Vpgm, a pass voltage Vpass, selection and non-selection read voltages Vrd and Vread, and the like.

The voltage generator 260 may generate selection line voltages VSSL and VGSL to be supplied to selection lines SSL and GSL at program and read operations. The voltage generator 260 may adjust a level of the non-selection read voltage Vread according to a temperature under the control of the control logic 250. That is, the voltage generator 260 may compensate for reduction of a channel current by increasing the non-selection read voltage Vread at a low temperature at which a channel current is reduced. Further, the voltage generator 260 may generate a non-selection read voltage Vread having two or more levels to provide it to word lines.

The nonvolatile memory device 200 may adjust a non-selection read voltage Vread according to a current temperature. Thus, the nonvolatile memory device 200 may compensate for reduction of a channel current by increasing the non-selection read voltage Vread when a temperature is lowered.

Figure 12:
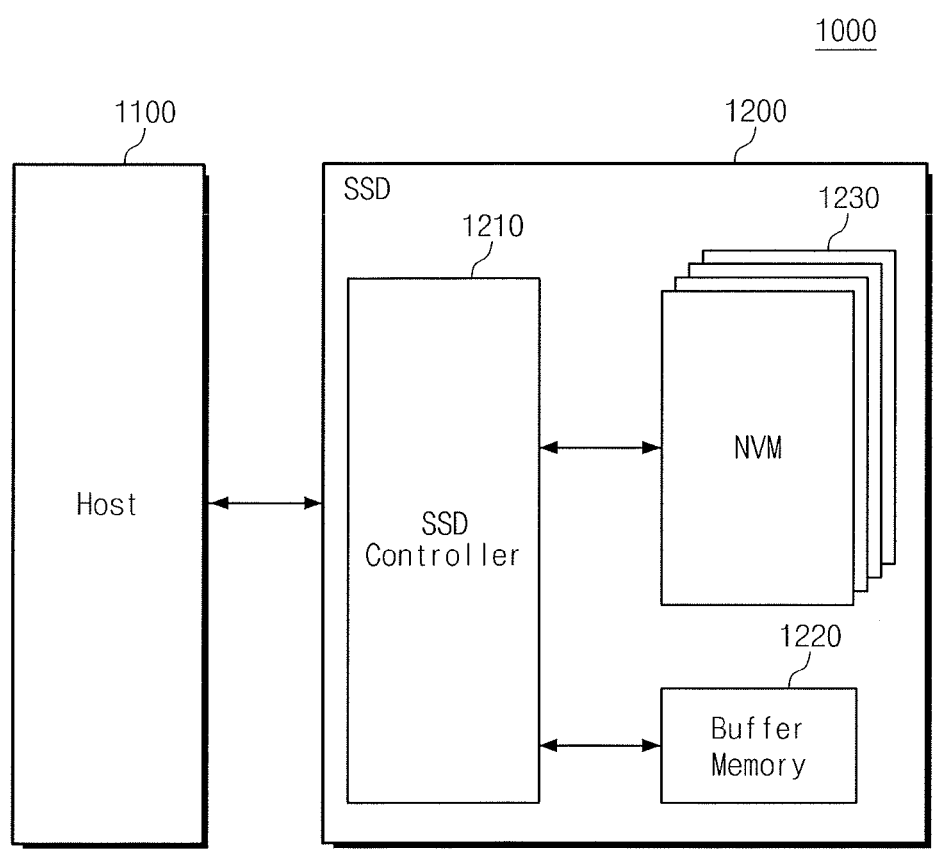
FIG. 12 illustrates a block diagram of a user device including a solid state drive according to an embodiment of the inventive concept.

FIG. 12 illustrates a block diagram of a user device including a solid state drive according to an embodiment of the inventive concept. Referring to FIG. 12, a user device 1000 may include a host 1100 and an SSD 1200. The SSD 1200 may include an SSD controller 1210, a buffer memory 1220, and a nonvolatile memory device 1230.

The SSD controller 1210 may provide physical interconnection between the host 1100 and the SSD 1200. The SSD controller 1210 may provide an interface with the SSD 1200 corresponding to a bus format of the host 1100. In particular, the SSD controller 1210 may decode a command provided from the host 1100. The SSD controller 1210 may access the nonvolatile memory device 1230 according to the decoding result. The bus format of the host 1100 may include USB (Universal Serial Bus), SCSI (Small Computer System Interface), PCI express, ATA, PATA (Parallel ATA), SATA (Serial ATA), SAS (Serial Attached SCSI), and the like.

The buffer memory 1220 may temporarily store write data provided from the host 1100 or data read out from the nonvolatile memory device 1230. In the event that data existing in the nonvolatile memory device 1230 is cached during a read request of the host 1100, the buffer memory 1220 may support a cache function of providing cached data directly to the host 1100. Typically, a data transfer speed of a bus format (e.g., SATA or SAS) of the host 1100 may be higher than that of a memory channel of the SSD 1200. That is, in the event that an interface speed of the host 1100 is remarkably fast, lowering of the performance due to a speed difference may be minimized by providing the buffer memory 1220 having a large storage capacity.

The buffer memory 1220 may be formed of a synchronous DRAM to provide sufficient buffering to the SSD 1200 used as an auxiliary mass storage device. However, the buffer memory 1220 is not limited to this disclosure.

The nonvolatile memory device 1230 may be provided as a storage medium of the SSD 1200. For example, the nonvolatile memory device 1230 may be formed of a NAND flash memory device having a mass storage capacity. The nonvolatile memory device 1230 may be formed of a plurality of memory devices. In this case, memory devices may be connected with the SSD controller 1210 by a channel unit. The nonvolatile memory device 1230 may adjust a develop time tDEV of a bit line or sensing node according to a current temperature Curr_Temp. Thus, the nonvolatile memory device 1230 may provide data of the high reliability by compensating for a variation in a channel current due to a variation in a temperature.

The nonvolatile memory device 1230 is not limited to a NAND flash memory device. For example, a storage medium of the SSD 1200 can be formed of a PRAM, an MRAM, a ReRAM, a FRAM, a NOR flash memory, and the like. Further, the inventive concept may be applied to a memory system which uses different types of memory devices together. The nonvolatile memory device 1230 may be configured substantially the same as that described FIG. 1.

Figure 13:
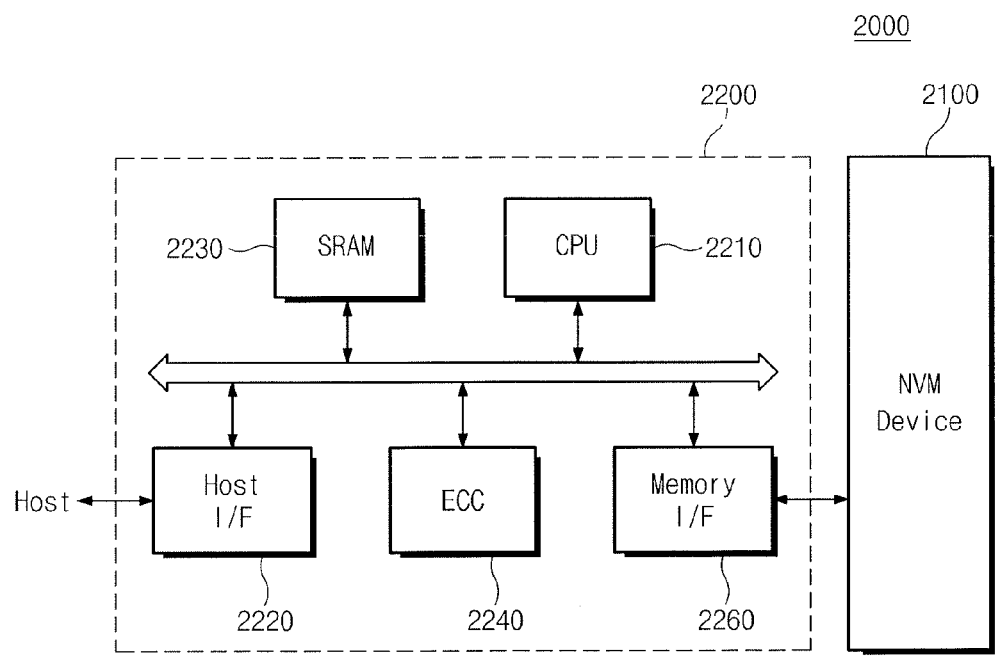
FIG. 13 illustrates a block diagram of a memory system according to another embodiment of the inventive concept.

FIG. 13 illustrates a block diagram of a memory system according to another embodiment of the inventive concept. Referring to FIG. 13, a memory system 2000 may include a flash memory 2100 and a memory controller 2200.

The flash memory 2100 may be configured substantially the same as that described FIG. 1, and description thereof is thus omitted. The flash memory 2100 may adjust a develop time tDEV of a bit line or sensing node according to a current temperature Curr_Temp. Thus, the flash memory 2100 may provide data of the high reliability by compensating for a variation in a channel current due to a variation in a temperature.

The memory controller 2200 may be configured to control the flash memory 2100. An SRAM 2230 may be used as a working memory of a CPU 2210. A host interface 2220 may include a data exchange protocol of a host connected with the memory system 2000. An ECC block 2240 may be configured to detect and correct errors included in data read out from the flash memory 2100. A memory interface 2260 may interface with the flash memory 2100 according to an embodiment of the inventive concept. The CPU 2210 may execute an overall control operation for data exchange of the memory controller 2200. Although not shown in FIG. 13, the memory system 2000 may further include ROM which stores code data for interfacing with the host.

The memory controller 2200 may communicate with an external device (e.g., host) via one of interface protocols such as USB, MMC, PCI-E, SAS, SATA, PATA, SCSI, ESDI, IDE, and the like.

In example embodiments, the memory system 2000 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

Figure 14:
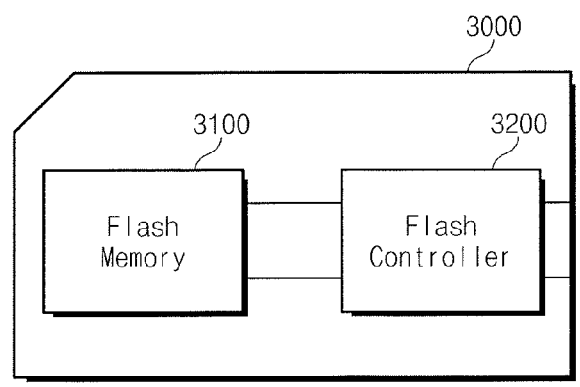
FIG. 14 illustrates a block diagram of a data storage device according to still another embodiment of the inventive concept.

FIG. 14 illustrates a block diagram of a data storage device according to still another embodiment of the inventive concept. Referring to FIG. 14, a data storage device 3000 may include a flash memory 3100 and a flash controller 3200. The flash controller 3200 may control the flash memory 3100 in response to control signals input from the outside of the data storage device 3000.

The flash memory 3100 may be configured substantially the same as that described FIG. 1. The flash memory device 3100 may be configured to have any one of a stack flash structure including arrays stacked at multiple layers, a source-drain free flash structure, a pin-type flash structure, and a three-dimensional (or, vertical) flash structure. The flash memory 3100 may adjust a develop time tDEV of a bit line or sensing node according to a current temperature Curr_Temp. Thus, the flash memory 3100 may provide data of the high reliability by compensating for a variation in a channel current due to a variation in temperature.

The flash controller 3200 may provide an interface between an external device and the flash memory 3100. The data storage device 3000 may be a memory card device, an SSD device, a multimedia card device, an SD device, a memory stick device, a HDD device, a hybrid drive device, or an USB flash device. For example, the data storage device 3000 may be a card which satisfies a standard for using a user device, such as a digital camera, a personal computer, and the like.

Figure 15:
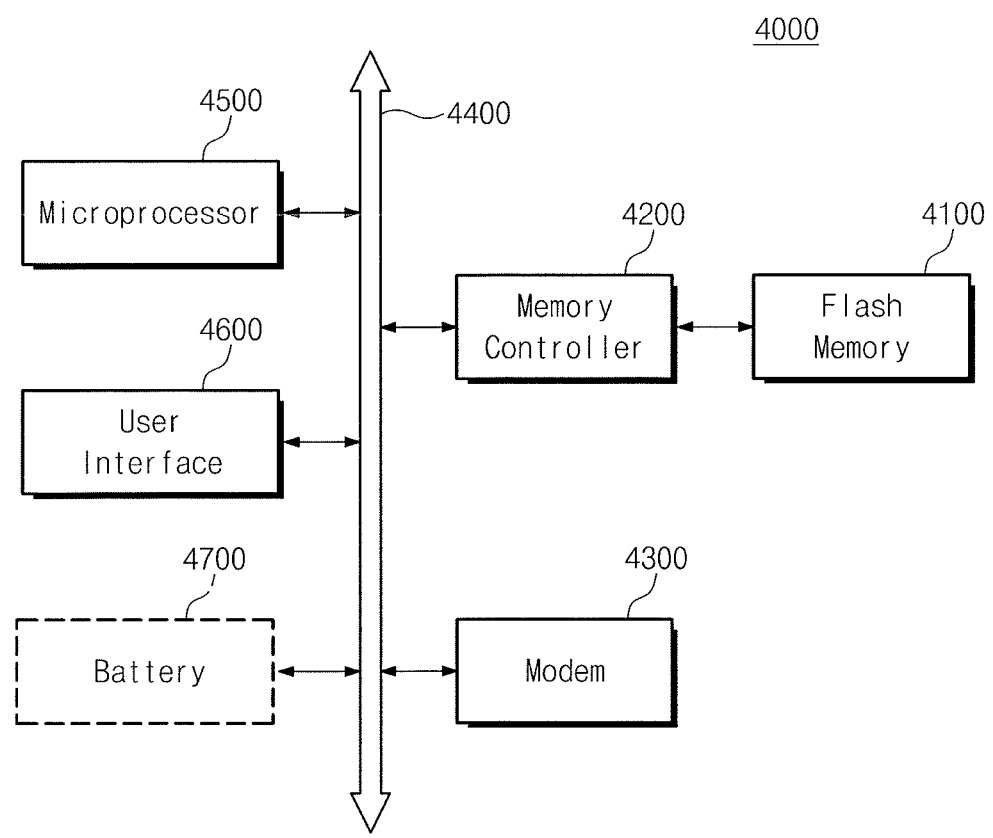
FIG. 15 illustrates a block diagram of a computing system including a flash memory device according to an embodiment of the inventive concept.

FIG. 15 illustrates a block diagram of a computing system including a flash memory device according to an embodiment of the inventive concept. A computing system 4000 may include a flash memory device 4100, a memory controller 4200, a modem 4300, such as a baseband chipset, a microprocessor 4500, and a user interface 4600. The elements 4200, 4300, 4500, and 4600 may be electrically connected to a bus 4400.

The flash memory device 4100 in FIG. 15 may be configured substantially the same as that illustrated in FIG. 1. The flash memory device 4100 may be configured to have any one of a stack flash structure including arrays stacked at multiple layers, a source-drain free flash structure, a pin-type flash structure, and a three-dimensional (or, vertical) flash structure.

The flash memory device 4100 may include a cell array having the all bit line structure. The flash memory device 4100 may further perform a partial page read mode. At the partial page read mode, the flash memory device 4100 may be configured to ground unselected bit lines and to perform fine sensing on selected bit lines. The flash memory 4100 may adjust a develop time tDEV of a bit line or sensing node according to a current temperature Curr_Temp. Thus, the flash memory 4100 may provide data of the high reliability by compensating for a variation in a channel current due to a variation in temperature.

If the computing system 4000 is a mobile device, it may further include a battery 4700 which powers the computing system 4000. Although not shown in FIG. 15, the computing system 4000 may further include an application chipset, a camera image processor (CIS), a mobile DRAM, and the like. The memory controller 4200 and the flash memory device 4100 may constitute a solid state drive/disk (SSD) which uses a nonvolatile memory to store data.

A nonvolatile memory device or a memory controller may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

By way of summary and review, embodiments are directed to compensating for variation in a channel current of a memory cell having a polycrystalline silicon channel due to a temperature by controlling a develop time. As a result, it is possible to reduce read error and to improve the integrity of data.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A nonvolatile memory device, comprising:
a memory cell connected to a bit line and a word line;
a page buffer, including a sensing node, electrically connected to the bit line to read data stored in the memory cell by sensing the sensing node;
a control logic controlling the page buffer to vary a develop time of the bit line being pre-charged according to a current temperature during a read operation; and
wherein the control logic comprises:
a parameter selector selecting a develop time corresponding to the current temperature; and
a timing controller controlling the page buffer to sense the memory cell according to the selected develop time.

2. The nonvolatile memory device as claimed in claim 1, wherein the memory cell is included in a three-dimensional NAND string formed in a direction vertical to a substrate.

3. The nonvolatile memory device as claimed in claim 1, wherein the control logic senses the memory cell according to a first develop time when the current temperature is over a reference temperature, and to a second develop time, longer than the first develop time, when the current temperature is below the reference temperature.

4. The nonvolatile memory device as claimed in claim 1, wherein the parameter selector includes develop times corresponding to a plurality of temperature ranges, respectively.

5. The nonvolatile memory device as claimed in claim 1, wherein the develop time of the bit line being pre-charged corresponds to a time when the bit line being pre-charged is electrically isolated from the sensing node.

6. The nonvolatile memory device as claimed in claim 1, wherein the control logic controls the page buffer to vary a develop time of the sensing node, the develop time of the sensing node corresponding to a period of time from a point of time when a setup transistor for pre-charging the bit line is turned off, until a point of time when a transistor for connecting the bit line and the sensing node is turned off.

7. The nonvolatile memory device as claimed in claim 6, wherein the page buffer further comprises a clamp transistor for clamping the sensing node into a predetermined level during the develop time of the sensing node.

8. The nonvolatile memory device as claimed in claim 1, further comprising:
a voltage generator adjusting and providing a read voltage to be supplied to the word line according to the current temperature.

9. The nonvolatile memory device as claimed in claim 1, further comprising:
a temperature sensor sensing the current temperature to provide the sensed current temperature to the control logic.

10. A nonvolatile memory device, comprising:
a plurality of memory cells connected in series to a bit line;
a page buffer connected to the bit line and sensing the memory cell;
a voltage generator providing a selection read voltage or a non-selection read voltage to a word line; and
a control logic controlling the page buffer or the voltage generator to adjust channel currents of the memory cells according to a current temperature during a read operation, wherein
the control logic includes:
a parameter selector selecting a develop time corresponding to the current temperature; and
a timing controller controlling the page buffer to sense the memory cell according to the selected develop time.

11. The nonvolatile memory device as claimed in claim 10, wherein the control logic controls the page buffer to adjust a develop time of the bit line according to the current temperature.

12. The nonvolatile memory device as claimed in claim 10, wherein the control logic controls the voltage generator to adjust a level of a non-selection read voltage to be provided to a word line of unselected memory cells according to the current temperature.

13. A nonvolatile memory device, comprising:
a memory cell connected to a bit line and a word line;
a page buffer electrically connected to the bit line and sensing data stored in the memory cell; and
a control logic controlling the page buffer to vary a width of a sensed threshold distribution according to a current temperature during a read operation, wherein
the control logic reduces the width of the sensed voltage distribution when the current temperature of the read operation is less than a temperature at which the memory cell was programmed.

14. The nonvolatile memory device as claimed in claim 13, further comprising:
a temperature sensor sensing the current temperature to provide the sensed current temperature to the control logic.

15. The nonvolatile memory device as claimed in claim 13, wherein the control logic reduces the width of the sensed voltage distribution by increasing a develop time of the bit line or a sensing node connected to the bit line.

16. The nonvolatile memory device as claimed in claim 13, wherein the memory cell is included in a three-dimensional NAND string formed in a direction vertical to a substrate.

* * * * *